United States Patent
Lin

(10) Patent No.: US 7,884,656 B2
(45) Date of Patent: *Feb. 8, 2011

(54) PHASE LOCKED LOOP WITH SMALL SIZE AND IMPROVED PERFORMANCE

(75) Inventor: Maco (Hann-Wen) Lin, Hsinchu (TW)

(73) Assignee: Broadcom Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/493,700

(22) Filed: Jun. 29, 2009

(65) Prior Publication Data

US 2009/0261874 A1 Oct. 22, 2009

Related U.S. Application Data

(63) Continuation of application No. 11/636,796, filed on Dec. 11, 2006, now Pat. No. 7,564,280.

(60) Provisional application No. 60/861,795, filed on Nov. 30, 2006.

(51) Int. Cl.
*H03L 7/06* (2006.01)

(52) U.S. Cl. ...................................... 327/156; 327/147

(58) Field of Classification Search .................. None
See application file for complete search history.

(56) References Cited

U.S. PATENT DOCUMENTS

| 4,069,462 | A  | * | 1/1978  | Dunn ........................... 331/11 |
| 5,818,304 | A  | * | 10/1998 | Hogeboom .................... 331/11 |
| 5,987,085 | A  | * | 11/1999 | Anderson .................... 375/374 |
| 6,310,521 | B1 | * | 10/2001 | Dalmia ........................ 331/11 |
| 6,326,826 | B1 | * | 12/2001 | Lee et al. ................... 327/161 |
| 7,103,337 | B2 | * | 9/2006  | Uozumi et al. ............... 455/255 |
| 7,148,764 | B2 | * | 12/2006 | Kasahara et al. ............. 331/179 |
| 7,564,280 | B2 | * | 7/2009  | Lin ............................. 327/156 |

* cited by examiner

*Primary Examiner*—Cassandra Cox
(74) *Attorney, Agent, or Firm*—Garlick Harrison & Markison; Holly L. Rudnick

(57) ABSTRACT

A phase locked loop (PLL) includes a frequency detector and a type 1 PLL including a phase detector. The phase detector produces a phase error signal indicative of a difference in phase between a reference signal and a feedback signal, while the frequency detector produces a frequency error signal indicative of a difference in frequency between the reference signal and the feedback signal. Logic switches between the phase detector and the frequency detector based on the frequency error signal.

20 Claims, 10 Drawing Sheets

PHASE LOCKED LOOP WITH SMALL SIZE AND IMPROVED PERFORMANCE

CROSS REFERENCE TO RELATED APPLICATIONS

The present U.S. Utility Patent Application claims priority pursuant to 35 U.S.C. §120, as a continuation, to the following U.S. Utility Patent Application which is hereby incorporated herein by reference in its entirety and made part of the present U.S. Utility Patent Application for all purposes:

1. U.S. Utility application Ser. No. 11/636,796, entitled "Phase Locked Loop with Small Size and Improved Performance,", filed Dec. 11, 2006, pending, which claims priority pursuant to 35 U.S.C. §119(e) to the following U.S. Provisional Patent Application which is hereby incorporated herein by reference in its entirety and made part of the present U.S. Utility patent application for all purposes:

a. U.S. Provisional Application Ser. No. 60/861,795, entitled "Phase Locked Loop with Small Size and Improved Performance," filed Nov. 30, 2006.

BACKGROUND

1. Technical Field

The present invention relates to wireless radio systems and, more particularly, phase locked loops for use in radio front end circuitry.

2. Related Art

The demand for high performance universal frequency synthesizers is growing with the increasing performance and integration requirements of wireless radio frequency (RF) systems, such as cellular telephony and FM radio systems. Phase locked loop (PLL) frequency synthesis is a popular indirect frequency synthesis method for high performance applications due to its agility and the ability of synthesizing frequencies over wide bandwidths with narrow channel spacing. However, PLL synthesizer design still remains a challenging aspect of RF system design, because of the stringent requirements typically imposed on frequency synthesizers. For example, frequency synthesizers are typically required to be defined with an output frequency accuracy on the order of a few parts per million (PPM). Furthermore, in most cases, the output frequency must also be capable of being varied in small precise steps, such as a few hundred kilo-hertz (kHz), corresponding to the RF channel spacing.

There are two predominant types of PLL frequency synthesizers, type 1 PLL's and type 2 PLL's. Type 1 PLL's typically include a precise crystal oscillator (X-TAL) providing a reference signal, a phase detector for producing an error signal indicative of a difference in phase between the reference signal and a feedback signal, a sample/reset lowpass loop filter (LPF) for filtering the error signal to produce a control voltage, a voltage controlled oscillator for producing an oscillation based on the control voltage and one or more divider blocks in the feedback path that each divide the incoming signal by some integer of either fixed or on-the-fly programmable value to produce the feedback signal. Type 2 PLL's differ from type 1 PLL's in that instead of a phase detector, type 2 PLL's typically include a phase frequency detector (PFD) for detecting a difference in phase or frequency between the reference signal and the feedback signal and a charge pump (CP) that generates a current pulse proportional to the difference in phase or frequency.

The combination of the PFD and charge pump enables type 2 PLL's to locking a wider range of frequencies than type 1 PLL'S. As such, type 2 PLL's are often used in analog and RF circuit designs. However, the system stability in type 2 PLL's is more difficult to manage than in type 1 PLL's. Therefore, type 2 PLL's typically require a double pole (second order) LPF to provide a narrow LPF bandwidth, while type 1 PLL's typically only need a single pole LPF. Double pole LPF's require larger capacitors than single pole LPF's. Therefore, the size of type 2 PLL's is usually much larger than the size of type 1 PLL's. For example, with a reference clock of 5 MHz, a type 2 PLL may require up to a 500 pF capacitor, while a type 1 PLL would need at most a 70 pF capacitor. However, the frequency locking range of the type 1 PLL would be only 143 MHz due to the phase detector operation limit, as compared to an approximately infinite frequency locking range of the type 2 PLL.

Therefore, a need exists for a PLL design with minimal size that provides a substantially infinite frequency locking range.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
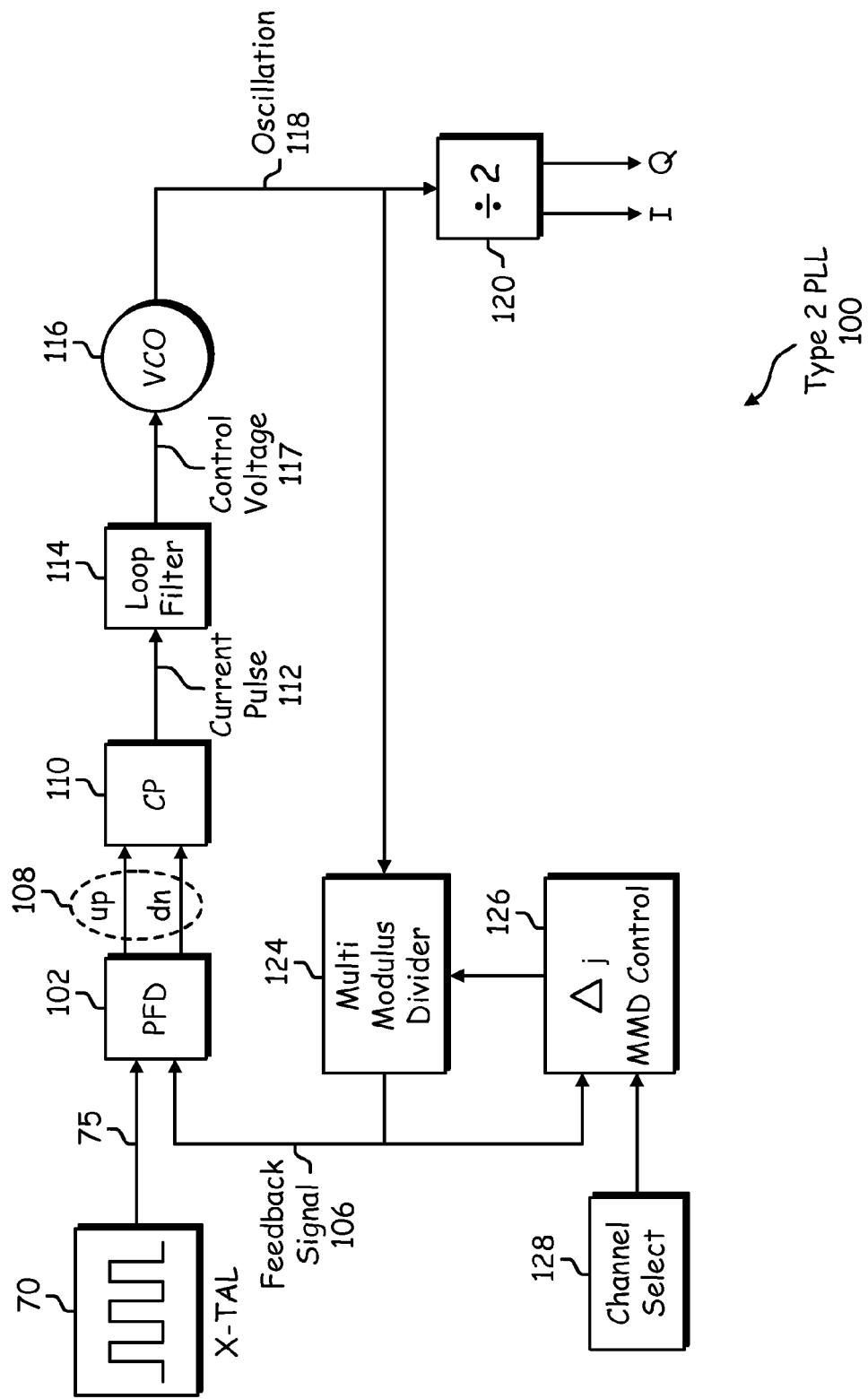
FIG. 1 is a schematic block diagram of a conventional type 2 phase locked loop (PLL)

FIG. 1 is a schematic block diagram of a conventional type 2 phase locked loop (PLL) 100. The type 2 PLL 100 includes a phase frequency detector (PFD) 102 that is coupled to receive a precise reference signal 75 from a crystal oscillator 70 for comparing with a feedback signal 106 to produce an error signal 108 indicative of a phase or frequency difference between the reference signal 75 and the feedback signal 106. The PFD 102 produces the error signal 108 through two outputs, UP and DN, whose states are determined by the differences between the reference signal 75 and the feedback signal 106. A charge pump (CP) 110 produces current pulses 112 based upon the error signal 108, and provides the current pulses 112 to a low pass loop filter (LPF) 114.

LPF 114 produces a control voltage 117 from the current pulses 112, and provides the control voltage 117 to a voltage controlled oscillator (VCO) 116. VCO 116 produces an oscillation 118 based on the control voltage 117, and inputs the oscillation 118 to a divider 120 in a first divider stage of a divider chain to produce I and Q components of a local oscillation signal to be mixed with an RF signal in a radio receiver. In the described embodiment, the divider 120 is a fixed integer divider. In addition, a programmable divider, such as a multi-modulus divider (MMD) 124, is used in a last divider stage of the divider chain before the feedback signal 106 is produced therefrom and is provided to the PFD 102. MMD 124 sets the integer divider ratio based upon a divider control signal received from a ΔΣ MMD controller 126. ΔΣ MMD controller 126 generates control signals to MMD 124 based upon a channel select value received from channel select logic 128. In a properly designed PLL, the feedback loop properties of the type 2 PLL results in the VCO output "locking" to a frequency equal to the product of crystal oscillator reference frequency and the "average" divide ratio of the divider chain.

It follows from the above discussion of the PFD 102 and the CP 110 that under nominal conditions, current pulses proportional to either a phase or a frequency difference between the reference and the feedback signals are generated by the PFD/CP combination. The action of the closed feedback loop is to cause the feedback signal to eventually settle such that both signals are "locked" in both phase and frequency. The degree to which deviations away from the locked state are allowed depends upon the sharpness of the loop filter 114 and ultimately determines the stability of the closed loop. Thus, a sharper or narrower filter bandwidth (e.g., a second-order filter) makes the closed loop more stable for the PLL.

Figure 2:
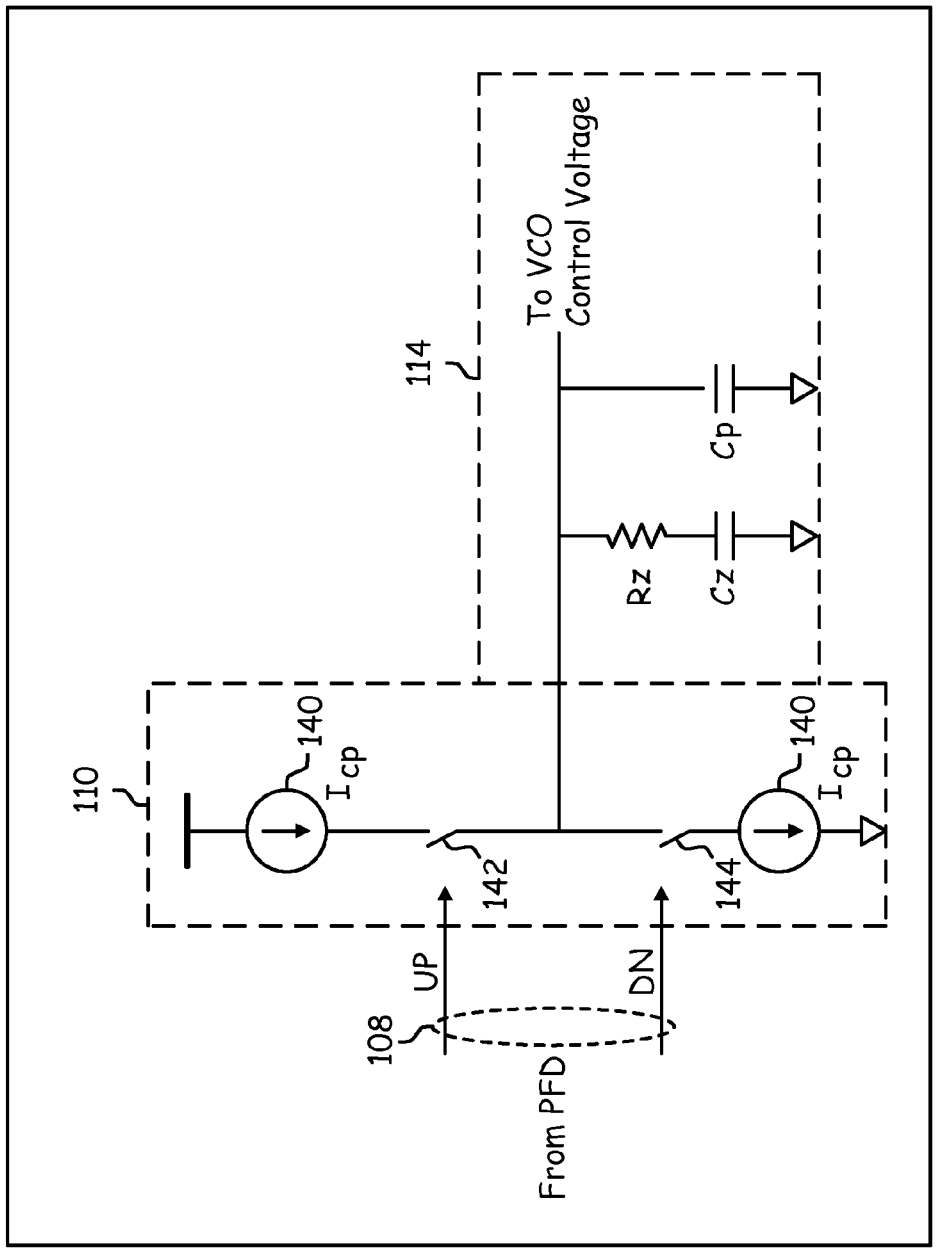
FIG. 2 is a functional block diagram of a conventional charge pump and lowpass loop filter (LPF) of a type 2 PLL.

FIG. 2 is a functional block diagram of an exemplary charge pump 110 and loop filter 114 of a conventional type 2 PLL. The charge pump 110 responds to the (UP, DN) control signals of error signal 108 of the PFD by either "pumping" current into the loop filter 114 or moving current out of the loop filter 114. The charge pump (CP) 110 includes two current sources 140 with a nominal output current ($I_{CP}$), in an arrangement with two switches implemented as MOSFETs 142 and 144 that are operatively biased by input signals UP and DN of error signal 108. Thus, CP 110 essentially functions as an asynchronously clocked digital-to-analog converter (DAC) whose nominal output CP(t) depends upon the digital inputs UP and DN such that:

$$y_{CP}(t) = \begin{cases} I_{CP}, & \text{if } \{UP, DN\} = \{1, 0\} \\ 0, & \text{if } \{UP, DN\} = \{1, 1\} \\ 0, & \text{if } \{UP, DN\} = \{0, 0\} \\ -I_{CP}, & \text{if } \{UP, DN\} = \{0, 1\} \end{cases}$$

The current pulses of CP 110 are filtered by the loop filter 114, thereby generating a smooth output control voltage ($V_{ctrl}$). The loop filter 114 shown in FIG. 2 consists of passive components, e.g., resistor Rz and capacitors Cz and Cp. The loop filter 114 shown in FIG. 2 is a second-order loop filter because it contains two poles and a zero. The zero is generated from the resistor Rz and capacitor Cz. In order to produce a more stable control voltage, the resistance of Rz and capacitance of Cz must both be large. For example, in an exemplary simulation with a reference clock of 5 MHz, the resistance of Rz was 21.81 kΩ, the capacitance of Cz was 109.5 pF and the capacitance of Cp was 4.55 pF.

Figure 3:
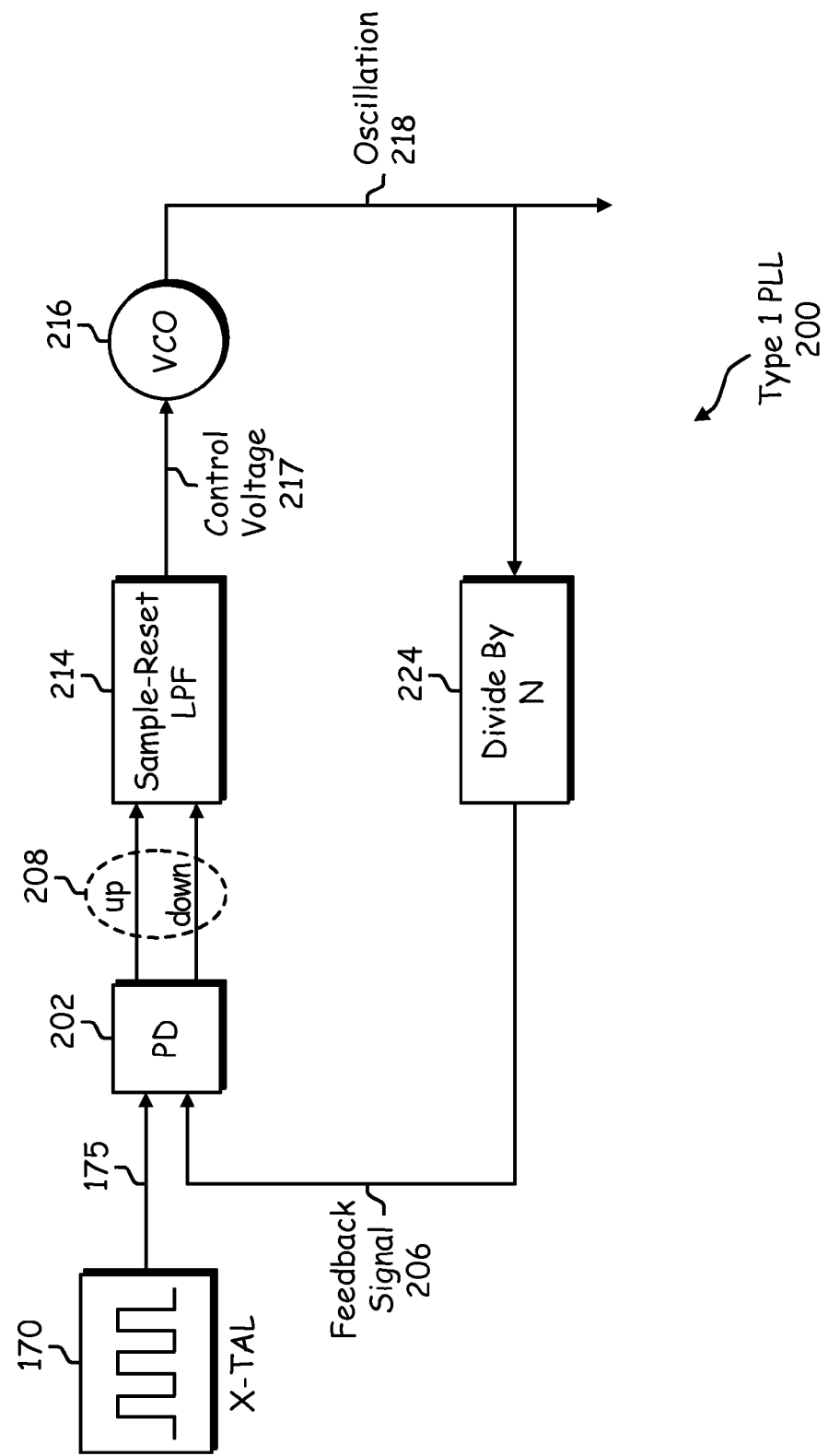
FIG. 3 is a schematic block diagram of a conventional type 1 PLL.

FIG. 3 is a schematic block diagram of a conventional type 1 phase locked loop (PLL) 200. The type 1 PLL 200 includes a phase detector (PD) 202 that is coupled to receive a precise reference signal 175 from a crystal oscillator 170 for comparing with a feedback signal 206 to produce an error signal 208 indicative of a phase difference between the reference signal 175 and the feedback signal 206. Thus, the type 1 PLL 200 provides essentially a phase lock function, and is only able to achieve frequency locking within a minimal frequency locking range.

The error signal 208 is again produced via two PD outputs, UP and DN, whose states are determined by the differences between the reference signal 175 and the feedback signal 206. The error signal 208 is provided to a sample-reset lowpass loop filter (LPF) 214. Sample-reset LPF 214 produces a control voltage 217 from the error signal 208, and provides the control voltage 217 to a voltage controlled oscillator (VCO) 216. VCO 216 produces an oscillation 218 based on the control voltage 217, and inputs the oscillation 218 to a fixed integer divider 224 to produce the feedback signal 206.

Figure 4:
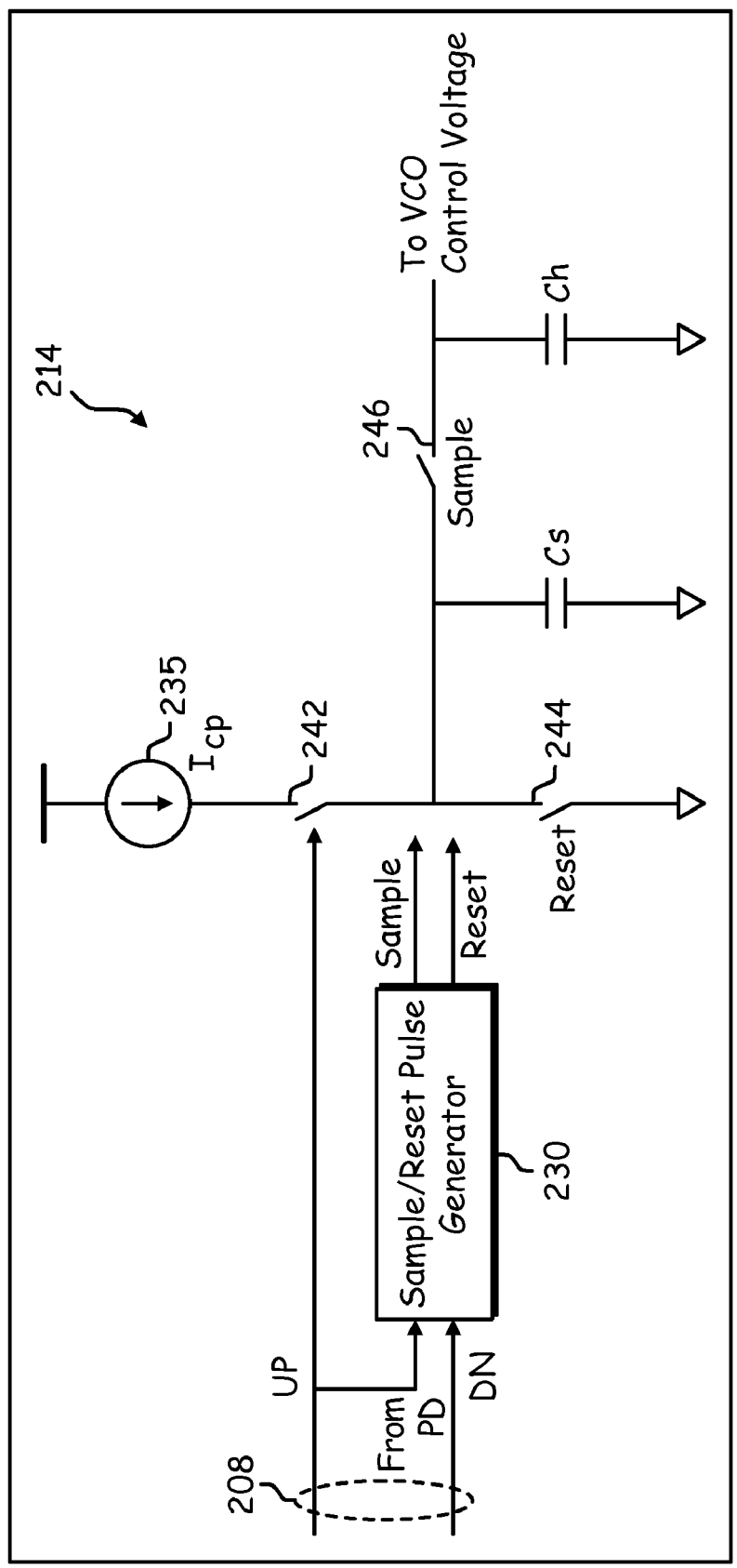
FIG. 4 is a functional block diagram of an exemplary LPF of a type 1 PLL, in accordance with embodiments of the present invention.

FIG. 4 is a functional block diagram of an exemplary sample-reset LPF 214 for use in a conventional type 1 PLL and for use within PLL designs in accordance with embodiments of the present invention. The sample-reset LPF 214 includes a sample-reset pulse generator 230 that responds to the (UP, DN) control signals of error signal 208 of the PD by generating a sample/reset signal that either provides a current pulse to the loop filter 214 or resets the loop filter 214. The sample/reset signal is produced via two outputs of the sample/reset pulse generator 230, SAMPLE and RESET. The sample-reset LPF 214 further includes a current source 235 with a nominal output current ($I_{CP}$) in an arrangement with three switches implemented as MOSFETs 242, 244 and 246 that are operatively biased by input signal UP of error signal 208 and the SAMPLE and RESET control signals of the sample-reset generator 230.

When a current pulse is produced via the SAMPLE control signal to the loop filter 214, the current pulse is filtered by the loop filter 214, thereby generating a smooth output control voltage ($V_{ctrl}$). The loop filter 214 shown in FIG. 4 consists of capacitors Cs and Ch. As such, the loop filter 214 shown in FIG. 4 is a single pole loop filter with reduced size as compared to the loop filter 114 shown in FIG. 2. For example, in an exemplary simulation with a reference clock of 5 MHz, the capacitance of Cs was 8 pF and the capacitance of Ch was 6 pF. Thus, the size of a type 1 PLL is typically only about 20% of the size of a type 2 PLL.

Figure 5:
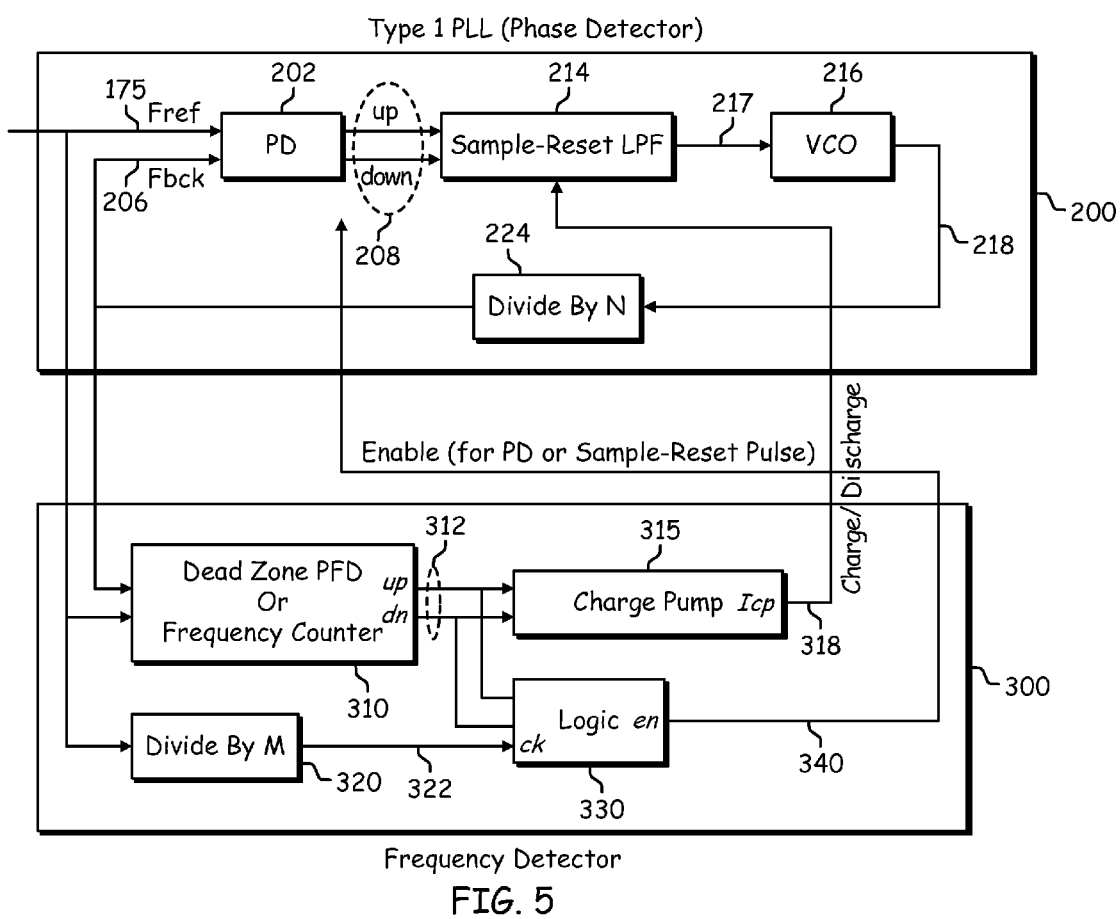
FIG. 5 is a schematic block diagram of an exemplary wide frequency locking range PLL using the small LPF of FIG. 4 in accordance with embodiments of the present invention.

FIG. 5 is a schematic block diagram of an exemplary wide frequency locking range PLL using the small LPF of FIG. 4 in accordance with embodiments of the present invention. The PLL of FIG. 5 includes a type 1 PLL 200 and a frequency detector 300. The exemplary type 1 PLL 200 shown in FIG. 5 is similar to that of the type 1 PLL 200 shown in FIG. 3. Thus, the type 1 PLL 200 shown in FIG. 5 includes the PD 202 that is coupled to receive a precise reference signal 175 from a crystal oscillator (not shown) for comparing with a feedback signal 206 to produce a phase error signal 208 indicative of a phase difference between the reference signal 175 and the feedback signal 206. The phase error signal 208 is again produced via two PD outputs, UP and DN, whose states are determined by the differences between the reference signal 175 and the feedback signal 206. The phase error signal 208 is provided to the sample-reset lowpass loop filter (LPF) 214 to produce a control voltage 217 therefrom. The sample-reset LPF provides the control voltage 217 to the VCO 216, which produces an oscillation 218 based on the control voltage 217, and inputs the oscillation 218 to the fixed integer divider 224 to produce the feedback signal 206. The operation of the type 1 PLL 200 is also the same as that described in FIG. 3 in that the type 1 PLL 200 provides essentially a phase lock function with minimal frequency locking range.

Therefore, in accordance with embodiments of the present invention, to increase the frequency locking range of the PLL, the PLL shown in FIG. 5 also includes a frequency detector 300. The frequency detector 300 operates to bring the frequency of the PLL output signal 218 to within the frequency locking range of the type 1 PLL 200. Once the frequency of the PLL output signal 218 is within the frequency locking range of the type 1 PLL 200, the type 1 PLL 200 operates to lock the phase of the PLL output signal 218. Since the phase difference produced during the operation of the frequency detector 300 can be easily removed during the operation of the type 1 PLL 200, the sample-reset LPF 214 need only be a single pole filter, as shown in FIG. 4, thus significantly reducing the size of the PLL of FIG. 5 in comparison to the size of the type 2 PLL shown in FIGS. 1 and 2, while still maintaining the nearly infinite locking range of the type 2 PLL shown in FIG. 1.

The frequency detector 300 includes a dead zone PFD or frequency counter 310 that is coupled to receive the precise reference signal 175 for comparing with the feedback signal 206 from the type 1 PLL 200 to produce a frequency error signal 312 indicative of a difference in frequency between the reference signal 175 and the feedback signal 206. The frequency error signal 312 is provided to a charge pump (CP) 315, which produces current pulses (Icp) 318 based upon the frequency error signal 312, and provides the current pulses 318 to the sample-reset lowpass loop filter (LPF) 214 of the type 1 PLL to charge/discharge the capacitors of the sample/reset LPF 214. Sample-reset LPF 214 produces a control voltage 217 from the current pulses 318, and provides the control voltage 217 to the VCO 216. The VCO produces an oscillation 218 based on the control voltage 217, and inputs the oscillation 218 to the fixed integer divider 224 to produce the feedback signal 206 to the frequency counter 310.

To switch between operation of the frequency detector 300 and the type 1 PLL 200, the frequency detector 300 further includes logic 330. In general, logic 330 is operable to disable the type 1 PLL 200 and enable the frequency detector 300 to bring the frequency of the PLL output signal 218 to within the frequency locking range of the type 1 PLL 200, and to disable the frequency detector 300 and enable the type 1 PLL 200 to lock the phase of the PLL output signal 218 when the frequency of the PLL output signal 218 is within the frequency locking range of the type 1 PLL 200.

More specifically, logic 330 is coupled to receive the frequency error signal 312 from the frequency counter 310 during operation of the frequency detector 300, and is operable to compare the frequency error signal 312 to the frequency locking range of the type 1 PLL 200 to determine whether the frequency error signal 312 indicates that the frequency of the feedback signal 206 is substantially equal to the frequency of the reference signal 175. If the frequency of the feedback signal 206 is substantially equal to the frequency of the reference signal 175, the logic 330 is operable to generate an enable signal 340 that enables the type 1 PLL 200 and disables the frequency detector 300. For example, the logic 330 generates the enable signal 340 if the ratio between the frequency of the feedback signal 206 and the frequency of the reference signal 175 is between 0.9 and 1.1. In an exemplary embodiment, the enable signal 340 enables or resets the PD 202 and disables or turns off the frequency counter 310 to allow the PD 202 to receive the reference signal 175 and the feedback signal 206 and to generate the phase error signal 208 therefrom.

However, if the frequency of the feedback signal 206 is not substantially equal to the frequency of the reference signal 175, the logic 330 does not generate the enable signal 340, and the frequency detector 300 remains enabled while the type 1 PLL 200 remains disabled. As shown in FIG. 5, the logic 330 is further clocked by a clock signal 322 that is produced by dividing the reference signal 175 by an integer divider 320.

An exemplary operation of the PLL of FIG. 5 follows. Upon initialization of the PLL (e.g., at start-up or after a channel hop), the frequency detector 300 is enabled and the type 1 PLL 200 is disabled. More specifically, the PD 202 is turned off and the frequency counter 310 is turned on so that the feedback signal 206 is processed by the frequency counter 310 and not the PD 202. The frequency counter 310 compares the feedback signal 206 to the reference signal 175 and produces a frequency error signal 312 indicative of a difference in frequency between the reference signal 175 and the feedback signal 206. The frequency error signal 312 is provided to both the CP 315 and the logic 330. The CP 315 produces current pulses (Icp) 318 based upon the frequency error signal 312, and provides the current pulses 318 to the sample-reset lowpass loop filter (LPF) 214 of the type 1 PLL to charge/discharge the capacitors of the sample/reset LPF 214, as described above.

The logic 330 compares the frequency error signal 312 to the frequency locking range of the type 1 PLL 200 to determine whether the frequency error signal 312 indicates that the frequency of the feedback signal 206 is substantially equal to the frequency of the reference signal 175 (i.e., whether the frequency of the PLL output signal 218 is within the locking range of the type 1 PLL 200). If so, the logic 330 generates the enable signal 340 to turn on the PD 202 and turn off the frequency counter 310, so that the feedback signal 206 produced in response to the current pulses 318 of the CP 315 is received at the PD 202 and not the frequency counter 310. If not, the logic 330 does not generate the enable signal 340, and the feedback signal 206 produced in response to the current pulses 318 of the CP 315 continues to be received at the frequency counter 310. Once the logic 330 determines that the frequency of the PLL output signal 218 is within the locking range of the type 1 PLL 200 and generates the enable signal 340, the type 1 PLL 200 takes over, as described above in connection with FIGS. 3 and 4, to lock the phase of the PLL output signal 218.

Figure 6:
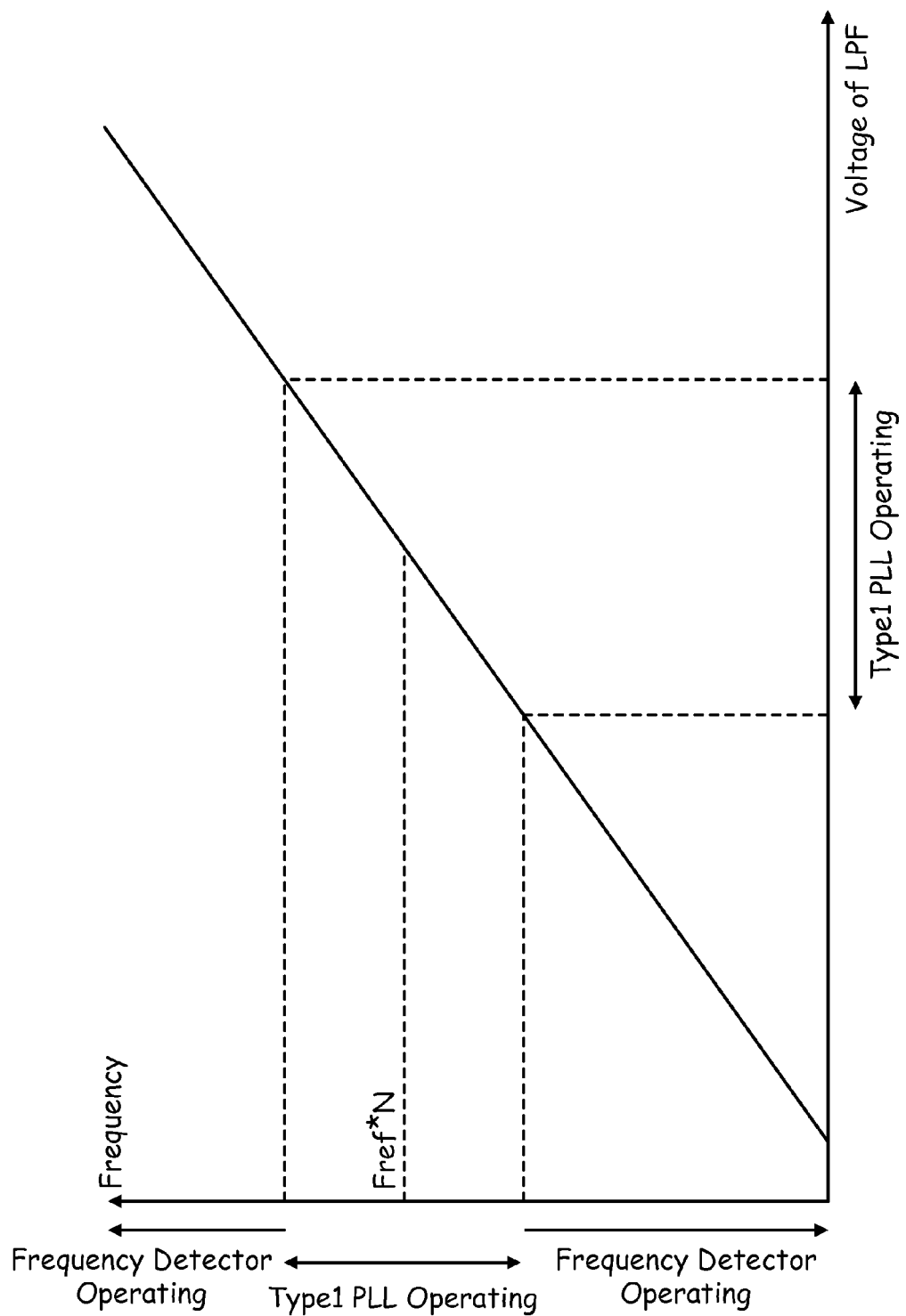
FIG. 6 is a diagram illustrating an exemplary operation of the PLL of the present invention.

FIG. 6 is a diagram illustrating an exemplary operation of the PLL of the present invention. In FIG. 6, the desired PLL output frequency is represented by the dotted line labeled Fref*N. The frequency locking range of the type 1 PLL is represented by the two dotted lines on either side of the desired PLL output frequency. Thus, while the frequency of the PLL output is outside of the frequency locking range of the type 1 PLL, the frequency detector is operating, and while the frequency of the PLL output is within the frequency locking range of the type 1 PLL, the type 1 PLL is operating.

Figure 7:
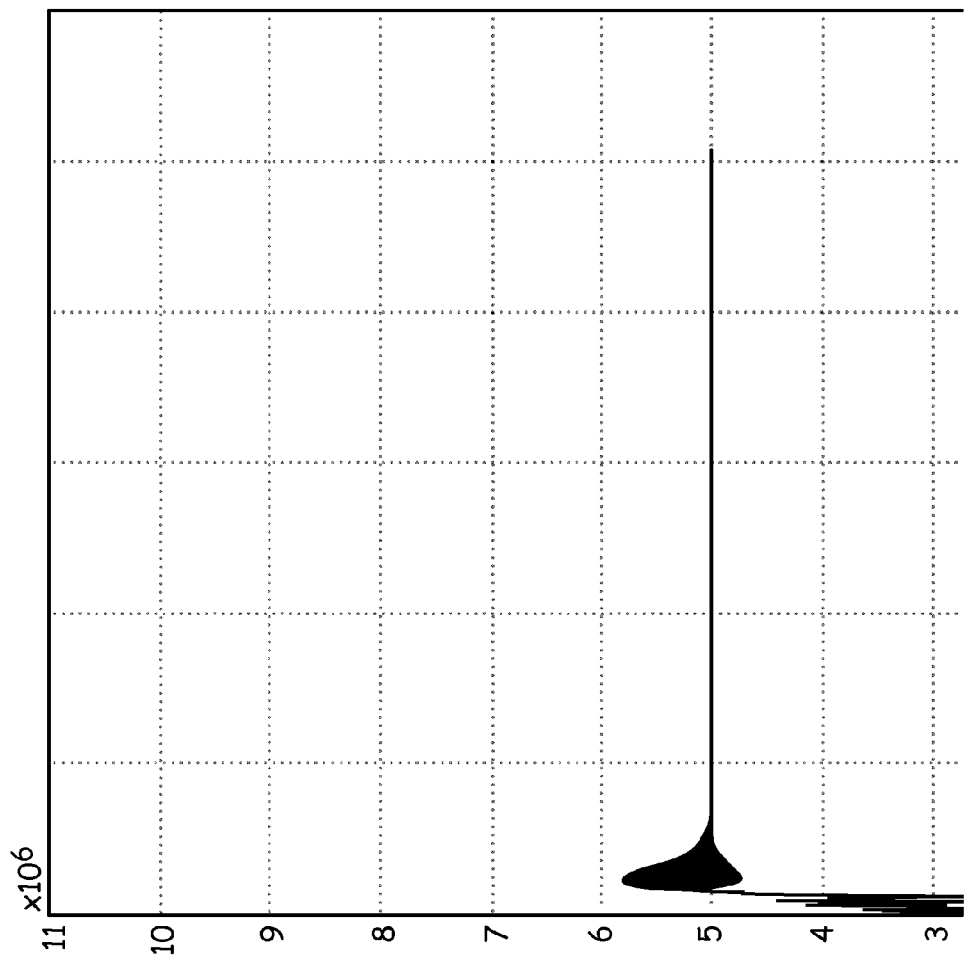
FIG. 7 is a simulation diagram illustrating an exemplary lock time of a conventional type 2 PLL.
Figure 8:
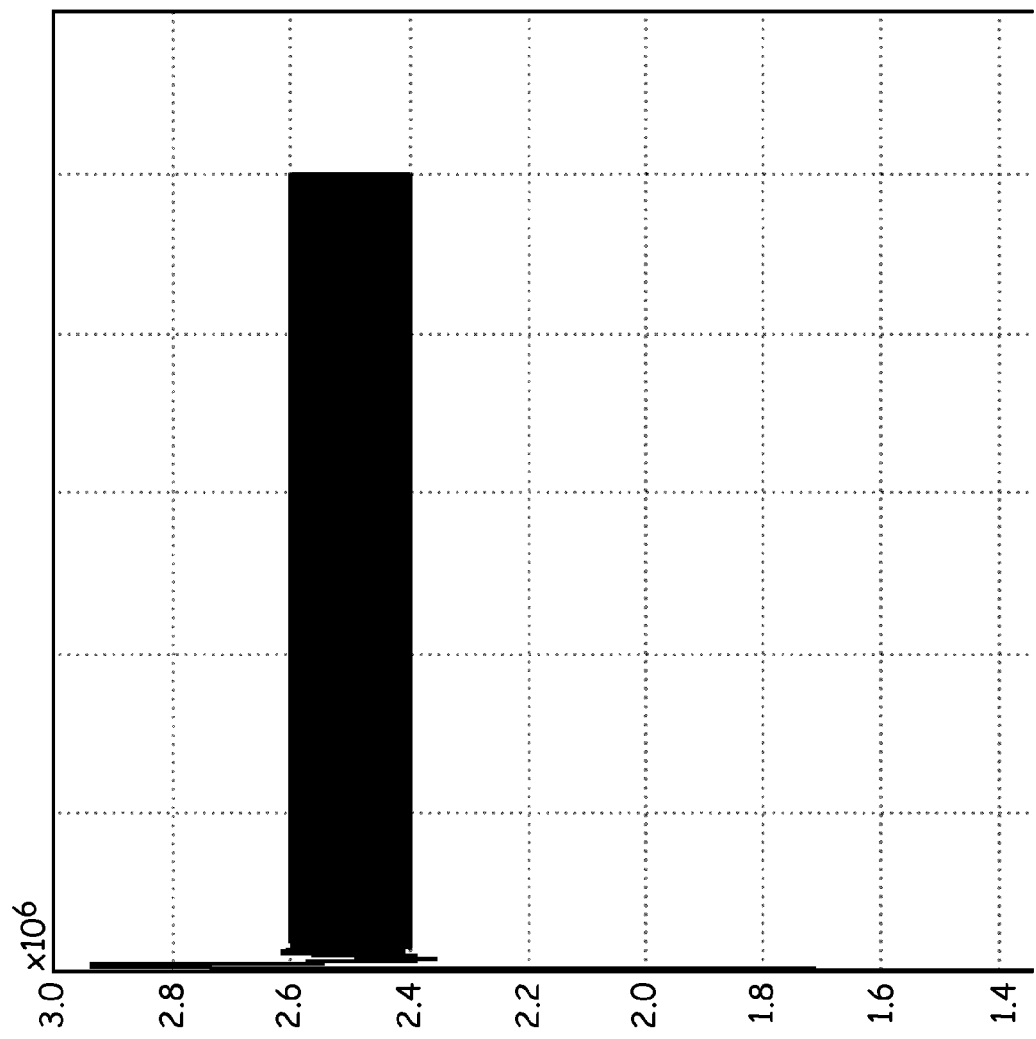
FIG. 8 is a simulation diagram illustrating an exemplary lock time of a conventional type 1 PLL.
Figure 9:
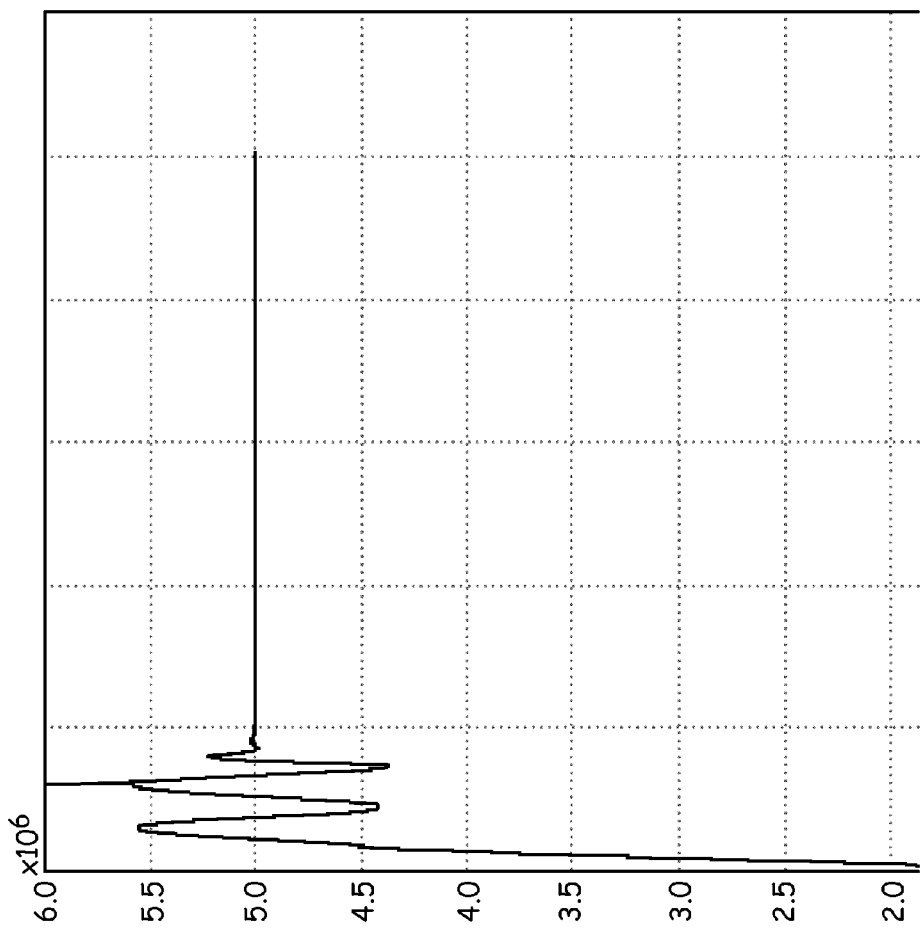
FIG. 9 is a simulation diagram illustrating an exemplary lock time of the PLL of the present invention.

FIGS. 7-9 are simulation diagrams illustrating exemplary lock times of a conventional type 2 PLL, a conventional type 1 PLL and a PLL designed in accordance with embodiments of the present invention, respectively. For each of the simulations, the VCO free running frequency was 100 MHz, the VCO gain was 500 MHz/V, the charge pump current was 20 uA, the reference clock was 5 Mhz and the desired PLL output frequency was 500 MHz.

For the type 2 PLL simulation, as shown in FIG. 7, the parameters of the second order LPF shown in FIG. 2 were as follows:

$C_z$=109.5 pF
$R_z$=21.81 kohm
$C_p$=4.55 pF.

As can be seen in FIG. 7, the type 2 PLL was able to quickly lock to the desired PLL output frequency of 500 MHz.

For the type 1 PLL simulation, as shown in FIG. 8, the parameters of the first order LPF shown in FIG. 4 were as follows:

$C_s$=8 pF
$C_h$=6 pF.

As can be seen in FIG. 8, when the free running frequency of the VCO was 100 MHz, it was impossible for the type 1 PLL to lock to a 500 MHz output frequency.

However, as can be seen in FIG. 9, with the first order LPF parameters described above in connection with FIG. 8 and the PLL design shown in FIG. 5, the PLL is able to easily lock to the desired PLL output frequency of 500 MHz. Thus, the PLL of the present invention has a nearly infinite locking range (just as the type 2 PLL), but a reduced size as compared to the type 2 PLL. As a result, the PLL of the present invention has a decreased chip size of the PLL, and thus decreased cost, as compared to a type 2 PLL, without sacrificing the performance of the type 2 PLL.

Figure 10:
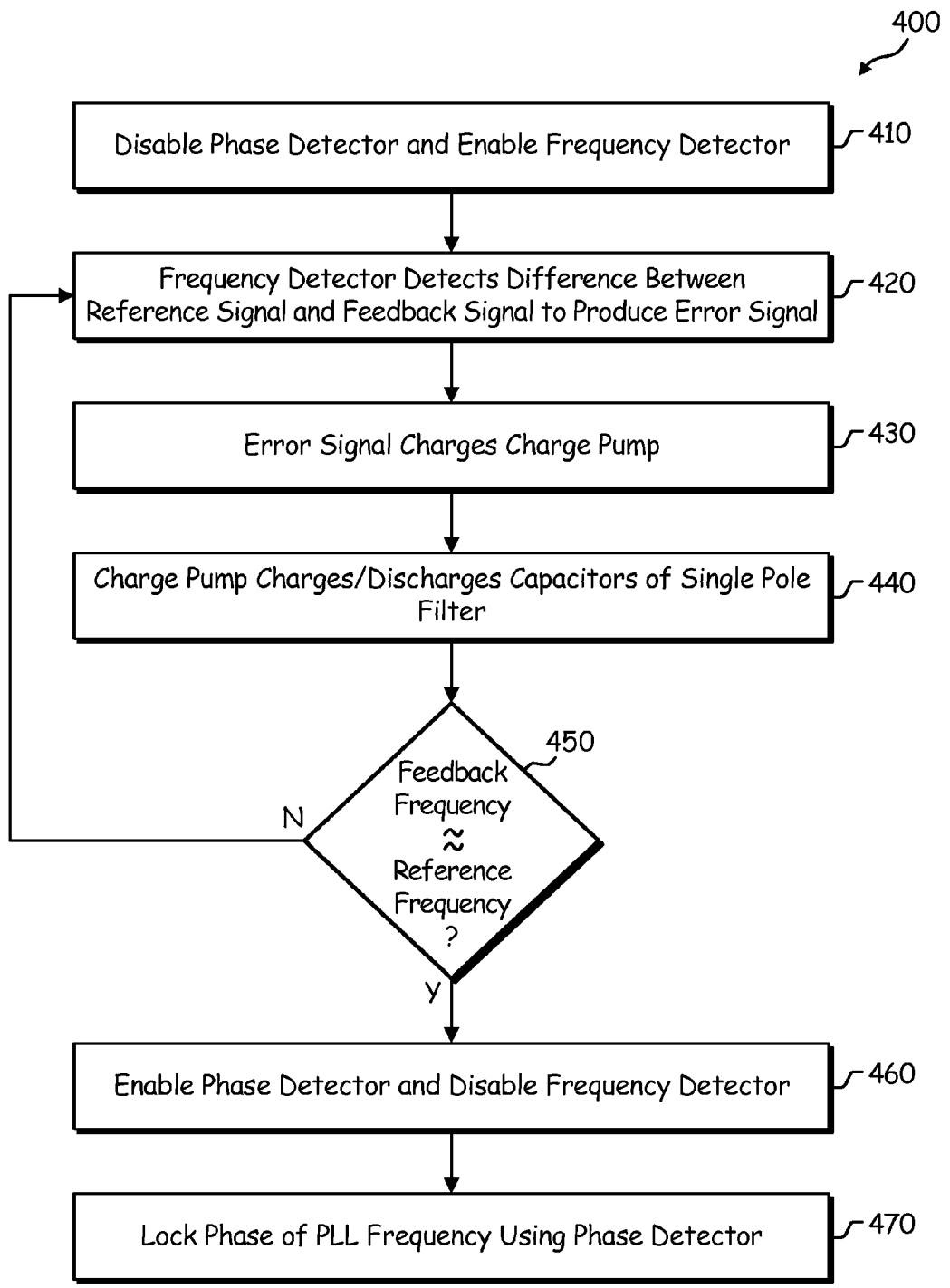
FIG. 10 is a flowchart illustrating an exemplary method for locking the phase and frequency of an output signal using a PLL according to one embodiment of the present invention.

FIG. 10 is a flowchart illustrating an exemplary method 400 for locking the phase and frequency of an output signal using a PLL according to one embodiment of the present invention. Initially, the method includes disabling a phase detector of a type 1 PLL and enabling a frequency detector (step 410). Once enabled, the frequency detector detects a difference in frequency between a reference signal and a feedback signal to produce an error signal (step 420). The error signal is used to change a charge pump of the frequency detector (step 430), and the charge pump charges/discharges the capacitors of a single pole filter of the type 1 PLL (step 440). The single pole filter produces a control voltage from the current pulses of the charge pump, and provides the control voltage to a voltage controlled oscillator (VCO), which produces an oscillation (PLL output signal) based on the control voltage, and inputs the oscillation to a fixed integer divider to produce the feedback signal 206 to the frequency detector.

The method further includes comparing the frequency of the feedback signal to the frequency of the reference signal to determine if the frequency of the feedback signal is approximately equal to the frequency of the reference signal (step 450). If not, the frequency detector remains enabled (step 420) to bring the frequency of the PLL output signal to within the locking range of the type 1 PLL. If so, the frequency detector is disabled and the phase detector of the type 1 PLL is enabled (step 460) to lock the phase of the PLL output signal using the type 1 PLL (step 470).

As may be used herein, the terms "substantially," "approximately" and "nearly" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has further been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The preceding discussion has presented a phase locked loop architecture with a minimal size and maximum frequency locking range and method of operation thereof. As one of ordinary skill in the art will appreciate, other embodiments may be derived from the teaching of the present invention without deviating from the scope of the claims.

The invention claimed is:

1. A phase locked loop (PLL), comprising:
a type 1 PLL including a phase detector operable to produce a phase error signal indicative of a difference in phase between said reference signal and said feedback signal, a single pole loop filter operable to filter said current pulse or said phase error signal to produce a control voltage, a voltage controlled oscillator operable to produce an oscillation based upon said control voltage and a frequency divider coupled to receive said oscillation and operable to divide said oscillation by a divide ratio to produce a feedback signal;

a frequency detector including a frequency counter operable to produce a frequency error signal indicative of a difference in frequency between the reference signal and the feedback signal and a charge pump operable to generate a current pulse proportional to said frequency error signal and to provide said current pulse to said single pole loop filter; and logic for switching between said phase detector and said frequency detector based on said frequency error signal.

2. The PLL of claim 1, wherein said logic disables said type 1 PLL and enables said frequency detector to bring the frequency of a PLL output signal to within a frequency locking range of said type 1 PLL.

3. The PLL of claim 2, wherein said logic disables said frequency detector and enables said type 1 PLL to lock the phase of said PLL output signal when the frequency of said PLL output signal is within said frequency locking range of said type 1 PLL.

4. The PLL of claim 1, wherein said frequency detector includes said logic.

5. The phase locked loop of claim 1, wherein said logic is operable to disable said frequency counter and enable said phase detector when said frequency error signal indicates that the frequency of said feedback signal is substantially equal to the frequency of said reference signal.

6. The phase locked loop of claim 5, wherein said logic is operable to disable said frequency counter and enable said phase detector when said frequency error signal indicates that the ratio between the frequency of said feedback signal and the frequency of said reference signal is between 0.9 and 1.1.

7. The phase locked loop of claim 1, wherein said single pole loop filter includes a sample/reset pulse generator operable to generate a sample/reset signal in response to said phase error signal, said single pole loop filter being operable to filter said sample/reset signal to produce said control voltage.

8. The phase locked loop of claim 7, wherein:
said single pole loop filter further includes at least one switch and at least one capacitor;
said at least one switch is controlled by said sample/reset signal or said current pulse to charge or discharge said at least one capacitor.

9. The phase locked loop of claim 8, wherein said at least one capacitor has a capacitance less than 100 pF.

10. The phase locked loop of claim 8, wherein said at least one capacitor has a capacitance less than 15 pF.

11. The phase locked loop of claim 8, wherein said at least one capacitor includes two capacitors coupled in parallel.

12. The phase locked loop of claim 11, wherein a first one of said two capacitors has a capacitance of 8 pF and a second one of said two capacitors has a capacitance of 6 pF.

13. A method for locking the phase and frequency of an output signal using a phase locked loop (PLL), comprising the steps of:
providing a type 1 PLL including a phase detector operable to produce a phase error signal indicative of a difference in phase between a reference signal and a feedback signal;
providing a frequency detector including a frequency counter operable to produce a frequency error signal indicative of a difference in frequency between said reference signal and said feedback signal and a charge pump operable to generate a current pulse proportional to said frequency error signal;
switching between said phase detector and said frequency detector based on said frequency error signal;
filtering one of said current pulse and said phase error signal using a single pole filter to produce a control voltage;
producing an oscillation based upon said control voltage; and
dividing said oscillation by a divide ratio to produce said feedback signal.

14. The method of claim 13, wherein said switching further comprises:
disabling said phase detector and enabling said frequency detector to bring the frequency of said output signal to within a frequency locking range of said type 1 PLL; and
disabling said frequency detector and enabling said phase detector to lock the phase of said output signal when the frequency of said output signal is within said frequency locking range of said type 1 PLL.

15. The method of claim 14, wherein said disabling said phase detector and enabling said frequency detector further comprises:
providing said feedback signal to said frequency counter to produce said frequency error signal.

16. The method of claim 14, wherein said disabling said frequency detector and enabling said phase detector further comprises:
analyzing said frequency error signal;
if said frequency error signal indicates that the frequency of said feedback signal is substantially equal to the frequency of said reference signal:
disabling said frequency counter,
enabling said phase detector to produce said phase error signal; and
providing said feedback signal to said phase detector.

17. The method of claim 14, wherein said disabling said frequency counter and enabling said phase detector further include:
disabling said frequency counter and enabling said phase detector when said frequency error signal indicates that the ratio between the frequency of said feedback signal and the frequency of said reference signal is between 0.9 and 1.1.

18. The method of claim 16, wherein said disabling said frequency counter and enabling said phase detector further include:
disabling said frequency counter and enabling said phase detector when said frequency error signal indicates that the difference between the frequency of said feedback signal and the frequency of said reference signal corresponds to an output frequency within the frequency locking range of the type 1 PLL.

19. The method of claim 13, wherein said filtering further comprises:
generating a sample/reset signal in response to said phase error signal; and
filtering said sample/reset signal to produce said control voltage.

20. The method of claim 19, further comprising:
providing said single pole loop filter with at least one switch and at least one capacitor, and wherein said filtering further comprises:
controlling said at least one switch by said sample/reset signal or said current pulse to charge or discharge said at least one capacitor.

* * * * *